(12) United States Patent
Trzeciakowski

(10) Patent No.: US 9,223,123 B2
(45) Date of Patent: Dec. 29, 2015

(54) METHOD AND DEVICE FOR COUPLING LASER LIGHT DERIVED FROM AT LEAST TWO LASER SOURCES INTO ONE OPTICAL FIBER

(75) Inventor: Witold Trzeciakowski, Warsaw (PL)

(73) Assignee: INSTYTUT WYSOKICH CISNIEN POLSKIEJ AKADEMII NAUK, Warsaw (PL)

( * ) Notice: Subject to any disclaimer, the term of this patent is extended or adjusted under 35 U.S.C. 154(b) by 515 days.

(21) Appl. No.: 13/501,219

(22) PCT Filed: Oct. 10, 2010

(86) PCT No.: PCT/PL2010/050052
§ 371 (c)(1),
(2), (4) Date: May 30, 2012

(87) PCT Pub. No.: WO2011/043682
PCT Pub. Date: Apr. 14, 2011

(65) Prior Publication Data
US 2012/0301076 A1  Nov. 29, 2012

(30) Foreign Application Priority Data

Oct. 10, 2009 (PL) .......................................... 389247

(51) Int. Cl.
*G02B 19/00* (2006.01)
*G02B 27/14* (2006.01)
(Continued)

(52) U.S. Cl.
CPC .......... *G02B 19/0057* (2013.01); *G02B 6/4204* (2013.01); *G02B 19/0028* (2013.01); *G02B 27/143* (2013.01); *G02B 6/262* (2013.01); *G02B 6/4214* (2013.01); *H01S 5/4012* (2013.01)

(58) Field of Classification Search
CPC .... G02B 6/4204; G02B 6/4214; G02B 6/262; G02B 6/2817; G02B 6/3512; G02B 6/4245
USPC ........ 385/18, 31, 33, 34, 47, 50, 52; 359/618, 359/629, 636, 641
See application file for complete search history.

(56) References Cited

U.S. PATENT DOCUMENTS

| 4,828,357 A | 5/1989 | Arata et al. |
| 5,333,077 A | 7/1994 | Legar et al. |

(Continued)

FOREIGN PATENT DOCUMENTS

| EP | 0486175 | 5/1992 |
| EP | 0796452 | 9/1997 |

(Continued)

*Primary Examiner* — Kaveh Kianni
*Assistant Examiner* — Hung Lam
(74) *Attorney, Agent, or Firm* — Horst M. Kasper

(57) ABSTRACT

The invention consists in passing a laser beam (3) from each of laser sources (1) through its individual first optical system (4), single reflecting this beam (3) from a substantially flat individual reflecting surface (7) towards an input facet (10') and focusing this beam (3) by a second common optical system on the input facet (10') of the fiber (10). The laser beams (3) are emitted by laser modules (1), each containing a single laser source in an individual housing (2) with a first optical system (4), fixed with respect to the housing (2). The housing (2) of each laser module (1) is mounted in a holder (17, 20). The second optical system (9) is placed directly in front of the input facet (10') of the fiber (10). An axis (12) of each first optical system (3) forms with an axis (13) of the second optical system (9) an angle ($\alpha$) ranging between 45 ($\alpha'$) and 145 ($\alpha''$) degrees. The individual reflecting surfaces (7) are either on the oblique truncations of rods (15, 19) placed parallel to the optical axis (13) of the second optical system (9) or on the lateral faces of the regular pyramid (8) with the number of sides of the pyramid base equal to the number of laser modules (1). Optical axis (13) of the second optical system (9) passes through the vertex and through the center of the base of this pyramid (8).

18 Claims, 10 Drawing Sheets

(51) Int. Cl.
  *G02B 6/26* (2006.01)
  *G02B 6/42* (2006.01)
  *H01S 5/40* (2006.01)

(56) References Cited

U.S. PATENT DOCUMENTS

| | | |
|---|---|---|
| 5,617,492 A | 4/1997 | Beach et al. |
| 5,825,551 A | 10/1998 | Clarkson et al. |
| 6,493,121 B1 * | 12/2002 | Althaus .................. 398/135 |
| 6,700,709 B1 | 3/2004 | Fermann |
| 6,765,725 B1 | 7/2004 | Fermann et al. |
| 7,556,439 B2 * | 7/2009 | Nakanishi et al. .............. 385/92 |
| 2007/0268571 A1 * | 11/2007 | Hu et al. ...................... 359/349 |

FOREIGN PATENT DOCUMENTS

| | | |
|---|---|---|
| EP | 1429434 | 6/2004 |
| PL | 173558 | 3/1998 |
| PL | 180445 | 2/2001 |
| WO | WO 99/47959 | 9/1999 |

\* cited by examiner

METHOD AND DEVICE FOR COUPLING LASER LIGHT DERIVED FROM AT LEAST TWO LASER SOURCES INTO ONE OPTICAL FIBER

TECHNICAL FIELD

The subject of this invention is a method and a device for coupling laser light derived from at least two laser sources into one optical fiber.

BACKGROUND ART

There are many well known methods of coupling a laser light into an optical fiber. In the case of semiconductor laser diodes the simplest solution is the so called "butt coupling" consisting in mechanical fixing of a fiber tip close to a laser mirror, disclosed for example in U.S. Pat. No. 4,837,768, U.S. Pat. No. 4,807,956 and JP 60123077 A.

Improved optical coupling is achieved by focusing laser light into a fiber tip using lenses. Collimated laser beam can be simply focused into the optical fiber using a single lens. Light emitted by a laser diode is focused using several cylindrical and spherical lenses, which has been disclosed, among others, in the U.S. Pat. No. 6,768,593. Laser light can also be focused on a fiber tip by means of a spherical mirror using a method disclosed in U.S. Pat. No. 4,902,093.

There are also known methods for coupling laser light from a few sources into the one, common optical fiber. For example, for two lasers, two collimated laser beams with perpendicular polarizations can be superimposed using the polarizing beamsplitter. In case when more than two laser sources are necessary it is possible to use a method known from WO 2005/041262. In this solution each source is coupled into a separate fiber, for example using one of the methods described above, and then a bundle of the fibers is coupled into one bigger fiber.

In order to obtain high power of light in an optic fiber it is common to use a so called laser bar (array) or stacked laser bars. A laser bar consists of a set of many identical parallel laser diodes (for example 20 diodes 0.5 mm apart) mounted in a single package and driven by the same voltage. A beam emitted by such bar is slowly divergent in the plane of the bar (slow axis) and strongly divergent is the perpendicular direction (fast axis). Therefore, first a cylindrical lens is used for collimating laser light in the perpendicular direction and next some optical setup is used for focusing light into the fiber. The examples of such methods are disclosed, among others, in U.S. Pat. No. 5,333,077. U.S. Pat. No. 6,700,709, U.S. Pat. No. 5,825,551, and U.S. Pat. No. 6,504,650 and U.S. Pat. No. 6,765,725. A simpler solution for a laser bar is a cylindrical lens coupling light from each laser in the bar into a separate thin fiber, and then the bundle of these fibers can be coupled to a single thick fiber, as it has been disclosed for example in EP 0486175. An interesting solution is a conical fiber tip (tapered light guide) with a diffraction grating diffracting a beam emitted by a laser bar disclosed in EP 1429434. U.S. Pat. No. 5,617,492 discloses a solution concerning stack of laser bars consisting in collimating a beam of each laser of the stack and then coupling all the light beams into a fiber using a single lens. European patent description EP 796482 discloses a method of coupling into a fiber a laser beams from a few bars not forming an array. In case of laser bars and stacks all lasers are similar (produced in the same epitaxial process) and mounted in a common package. A power supply is also common for all lasers.

There are also known solutions for coupling laser beams from many separate sources, with separate power supplies and emitting light with different wavelengths. U.S. Pat. No. 4,828,357 discloses focusing beams from many lasers into one spot using a set of mirrors. Each laser beam is directed by two individual mirrors and then one concave mirror focuses all beams into one spot. However, this publication does not include any teaching concerning adjustments of the elements of such complex optical system. Practice proves, that with the increased number of lasers such system will be more difficult to adjust and more sensitive to mechanical shocks.

The prior art closest to the present invention has been disclosed in international publication WO-A1-00/45208. An apparatus A method disclosed in the publication uses a single reflecting element consisting of a set of individual reflecting-surfaces. The laser beam from each source passes through the first optical system of two afocal lenses and then is reflected from one of the reflecting surfaces towards the second optical system, focusing light on a fiber facet. In the disclosed solution the second optical system also consists of two lenses. The role of the afocal systems is to reduce a diameter of the beams incident on the mirrors and on the fiber facet. Examples of embodiments disclosed in this publication consider only flat configurations i.e. such that the beams from all laser sources lie in one plane from the sources to the fiber. Moreover, this publication does not contain any teaching concerning a method of adjusting all components of the system, which is crucial for the practical realization of the solution. JP-A-2007/065600 and JP-A-403001881 disclose apparatus for coupling laser light derived form several laser sources in to one optic fiber in which the laser sources surround a set of individual reflecting surfaces jointly forming a lateral surface of a regular pyramid. Number of sides of the pyramid base equal to the number of the laser sources.

DISCLOSURE OF INVENTION

A goal of the invention was to achieve a simple method of coupling light emitted by many separate laser sources into a single fiber. A method according to the invention consists in passing a laser beam from each of the laser sources through its individual first optical system, single reflecting it from a substantially flat individual reflecting surface towards an input facet of the fiber and focusing this beam by a common for all the beams second optical system on the input facet of the fiber. The laser light is emitted by laser modules, each containing a single laser source in an individual module housing. To the housing of the module a first optical system is connected in fixed position with respect to the housing. Each laser module housing is mounted in a holder. The second optical system is placed directly in front of the input facet of the fiber. The axis of each first optical system forms with the axis of the second optical system an angle ranging from 45 to 145 degrees. The method is characterized by that the individual reflecting surfaces are on the oblique truncations of the rods placed parallel to the optical axis of the second optical system.

In one variant of the method according to the invention the rods with individual reflecting surfaces are densely packed in the close neighborhood of the axis of the second optical system.

In the next variant of the method according to the invention, seven rods with individual reflecting surfaces are used and the first rod is placed on the optical axis of the second optical system while the remaining six rods surround uniformly the first rod.

In another variant of the method according to the invention, twelve rods with individual reflecting surfaces surrounding the first seven rods with individual reflecting surfaces are additionally used.

In yet another variant of the method according to the invention, the position of the laser beam from each of the laser modules on the input facet of the fiber is adjusted by changing a position of the housing of the laser module with respect to its holder. A required position of the laser module is then fixed by using a low-temperature solder, advantageously Wood alloy, solidifying in the slit between the housing of the laser module and its holder.

In yet another variant of the method according to the invention, the holders for laser modules are located in a cylindrical housing which is substantially coaxial with the optical axis of the second optical system.

In yet another variant of the method according to the invention, the holders for laser modules are located in a spherical housing which is substantially coaxial with the optical axis of the second optical system.

In both of the above-mentioned variants openings made in said cylindrical and spherical housings may form the holders for the laser modules.

In the last variant of the method according to the invention instead the individual reflecting surfaces in form of oblique truncations of the rods are used individual reflecting surfaces jointly forming a lateral surface of a regular pyramid. The number of sides of the pyramid base is equal to the number of the laser sources. The optical axis of the second optical system passes through the vertex and through the center of the base of the pyramid.

Position of the laser beam from each laser module on the input facet of the fiber is adjusted by changing a position of the laser module housing with respect to its holder. A required position of the laser module is then fixed after adjusting by using a low-temperature solder, advantageously Wood alloy, solidifying in a slit between the laser module and its holder.

In a device according to the invention each of the laser sources has got its first optical system and an individual substantially flat reflecting surface directing the beam towards an input facet of the fiber. The fiber has got a common for all the laser sources second optical system which focuses all laser beams on the input facet.

Each laser source has got an individual housing and a first optical system connected with the housing in fixed position with respect to this housing. The laser source, the housing and the first optical system jointly form a laser module. Each of the laser modules housing is mounted in a holder. The second optical system is placed directly in front of the input facet of the fiber. Axis of each first optical system with axis of the second optical system forms an angle ranging from 45 to 145 degrees. The device is characterized in that individual reflecting surfaces are on the oblique truncations of the rods placed parallel to the optical axis of the second optical system.

In one of the variants of the device according to the invention the rods with individual reflecting surfaces are densely packed in the close neighborhood of the axis of the second optical system.

In next variant of the device according to the invention, the device contains seven rods with the individual reflecting surfaces. A first rod is placed on the optical axis of the second optical system while the remaining six rods surround uniformly the first rod.

Next variant of the device according to the invention contains additionally twelve rods with the individual reflecting surfaces surrounding the first seven rods with the individual reflecting surfaces.

In another variant of the device according to the invention, a required position of the housing of the laser module is fixed by a low-temperature solder, advantageously Wood alloy, solidifying in a slit between the laser module and its holder.

In next version variant of the device according to the invention, the laser module holders are in a cylindrical housing which is substantially coaxial with the optical axis of the second optical system.

In next variant of the device according to the invention, the laser module holders are in a spherical housing which is substantially coaxial with the optical axis of the second optical system.

In both variants of the device according to the invention openings made in the described cylindrical and spherical housings may be the laser module holders.

In last variant of the device according to the invention instead of the individual reflecting surfaces in form of a oblique truncations of the rods the device contains individual reflecting surfaces jointly forming lateral surface of a regular pyramid. Number of sides of the pyramid base is equal to the number of laser sources, and the optical axis of the second optical system passes through vertex and through center of base of the pyramid. Position of each of the laser beam from each of the laser modules on the input facet of the fiber is adjusted by changing a position of the housing of the laser module with respect to its holder is fixed by low-temperature alloy, advantageously Wood alloy, solidifying in a slit between the housing of the laser module and its holder.

In one of the versions of the second variant of the device according to the invention the laser module holders are mounted on a circle concentric with optical axis of the second optical system, and the angle between the axes of all first optical systems and the optical axis of the second optical system equals 90 degrees.

In another version of the second variant of the device according to the invention position of each of the laser module housing with respect to its holder is fixed by low-temperature solder, advantageously Wood alloy, solidifying in a slit between the laser module and its holder.

The invention allows for a simple and effective coupling of many laser beams with different wavelengths and intensities into one fiber. Possibility of using not only laser diodes but also solid-state lasers (diode-pumped DPSS and with frequency doubling) results in a wide range of available wavelengths. In particular, mixing in the fiber red, green and blue beams allows to achieve arbitrary colors, including white. The application of closely packed rods with individual reflecting surfaces or of the reflecting regular pyramid allows to achieve laser beams close to the optical axis of the collimator which leads to reduced aberrations of the collimator and the beams close to the axis can be focused to a smaller spot. Relatively large separation of individual laser sources from each other allows good cooling. The adjustment using the low-temperature metallic solder simplifies the construction and improves the evacuation of heat generated by the laser source.

BRIEF DESCRIPTION OF DRAWINGS

The invention is presented in three exemplary embodiments on drawings, where

FIG. 1 shows the schematic traces of three laser beams coupled to one fiber, while

FIG. 3 shows a perspective view of the first exemplary embodiment of the invention, while

FIG. 5 shows the second exemplary embodiment of the invention in a perspective view, while

FIG. 7 shows the third exemplary embodiment of the invention in a perspective view, while

FIG. 12 and FIG. 13 show, respectively a perspective view and a cross-section of an exemplary set of nineteen reflecting surfaces, while

MODE FOR CARRYING OUT THE INVENTION

Below will be described in detail three exemplary embodiments of a device according to the invention realizing a method according to the invention.

Figure 1:
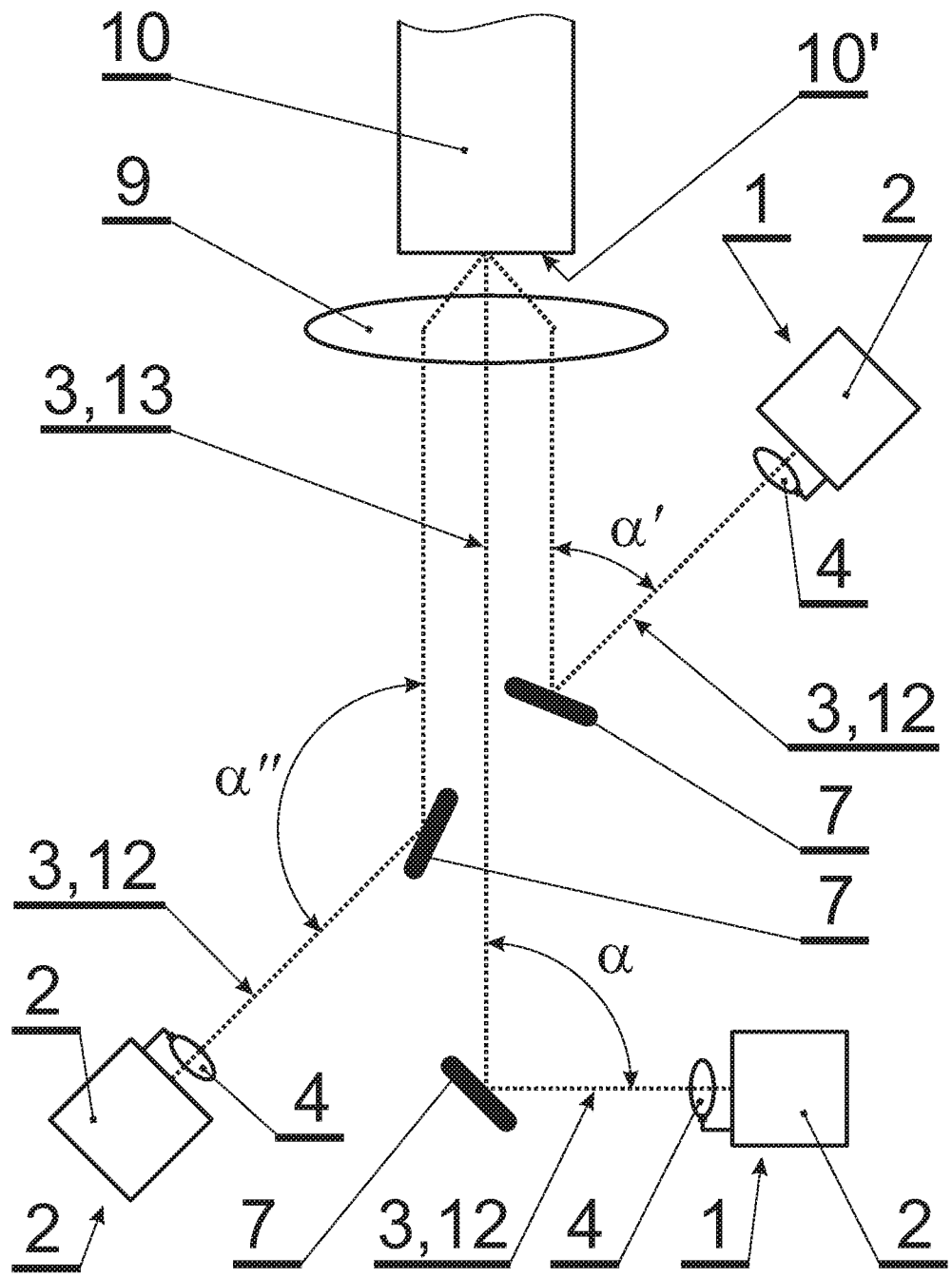
Figure 2:
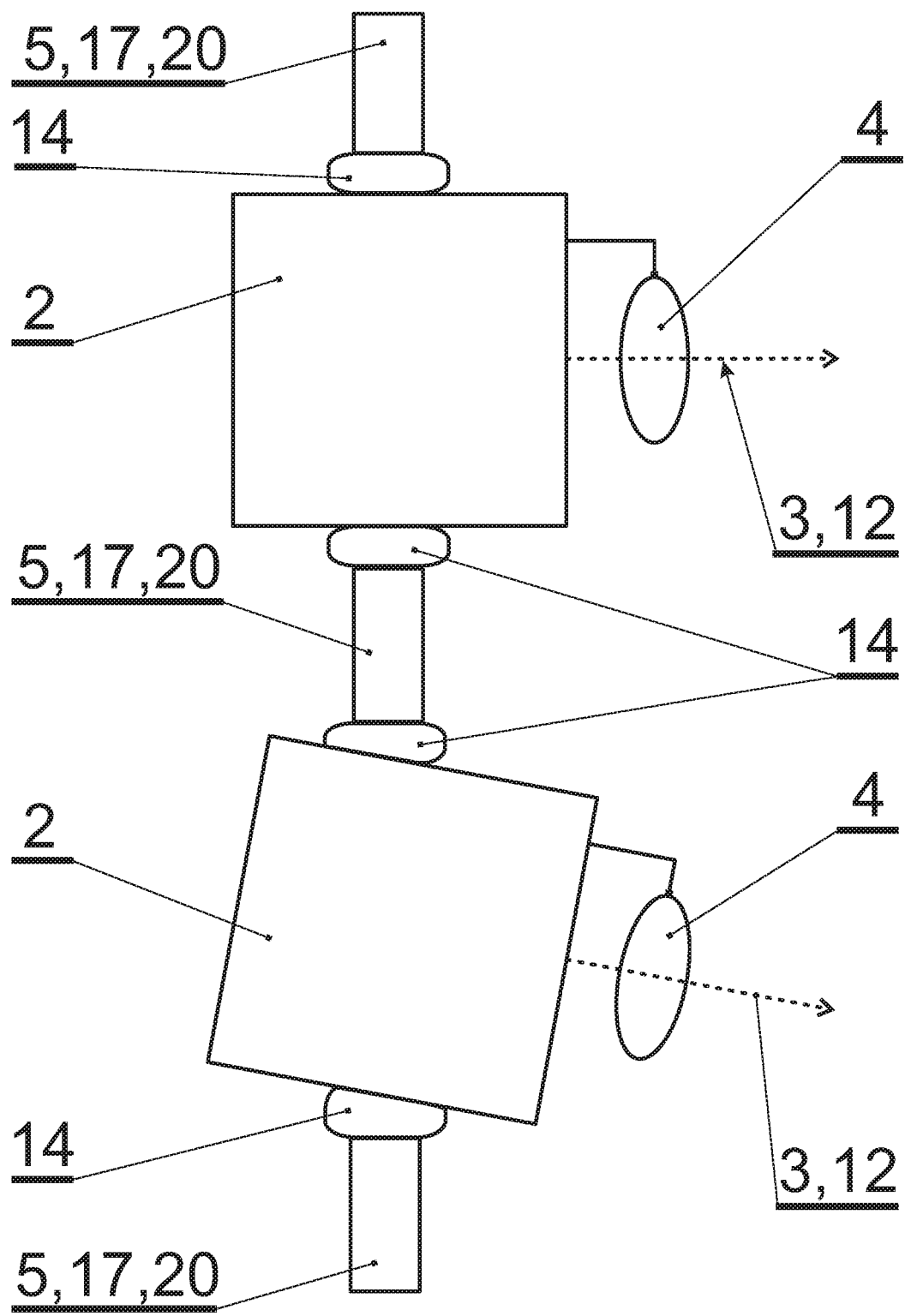
FIG. 2 shows schematically exemplary fixing a position of a laser housing in relation to its holder after adjustment.
Figure 3:
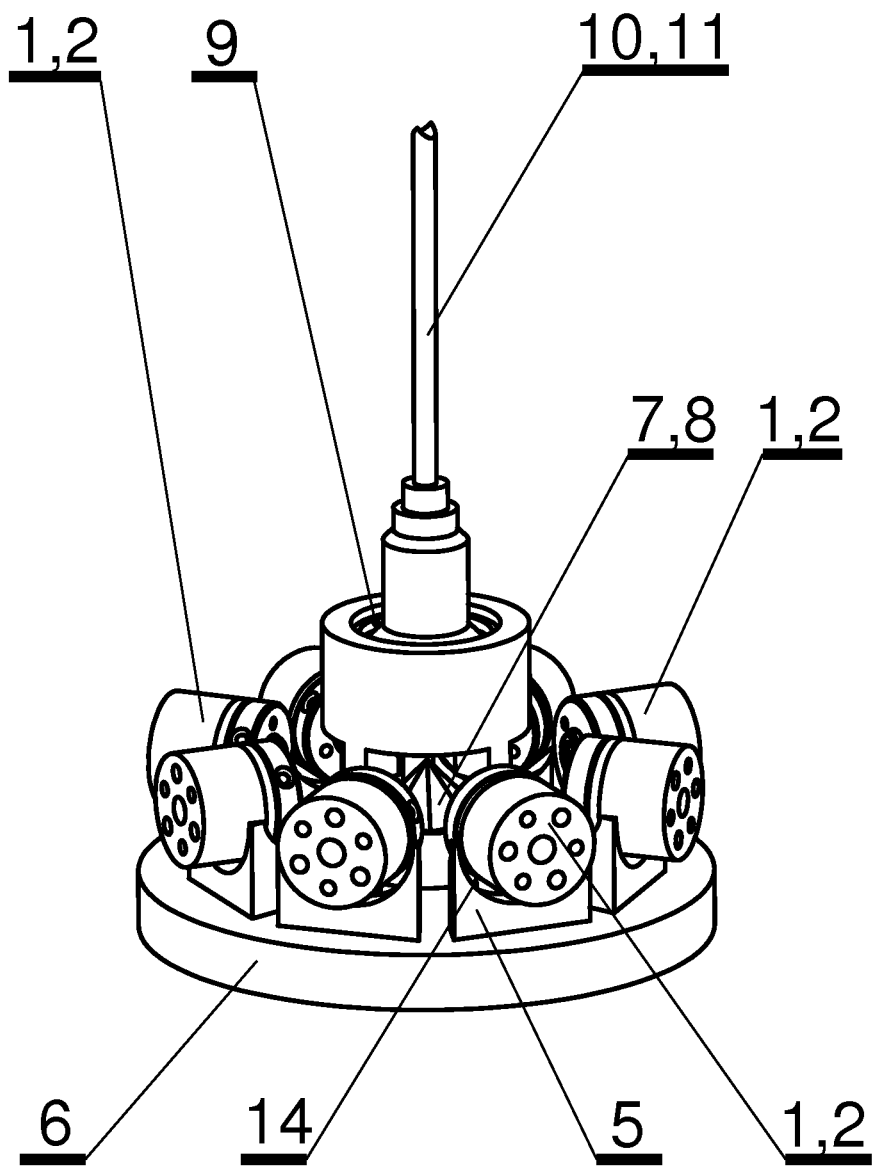
Figure 4:
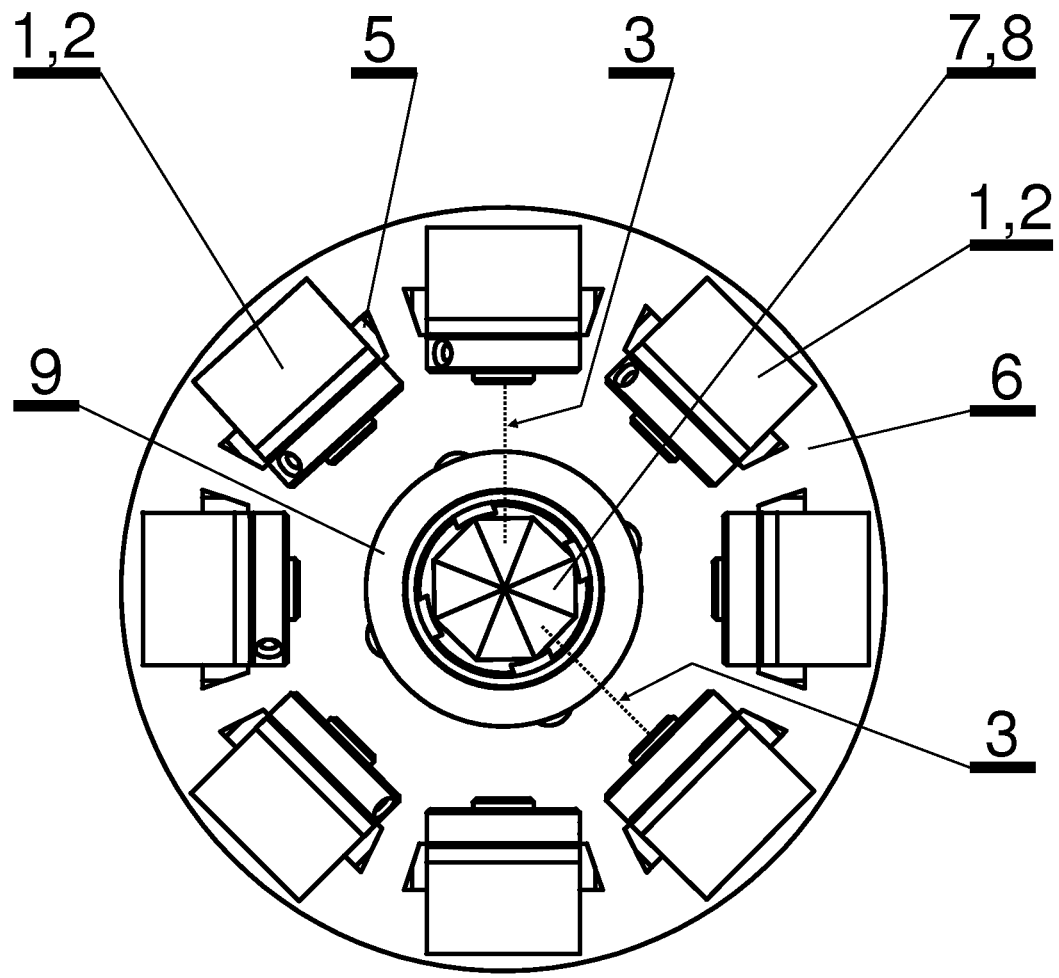
FIG. 4 shows a top view of this embodiment with a collimator removed.
Figure 9:
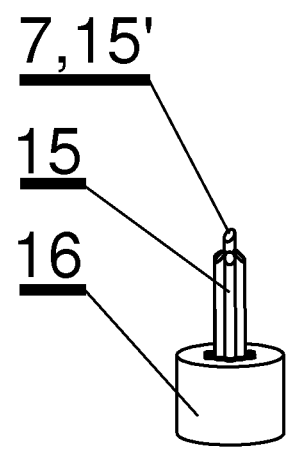
FIG. 9 and FIG. 10 show, respectively a perspective view and a cross-section of an exemplary set of seven reflecting surfaces.
Figure 10:
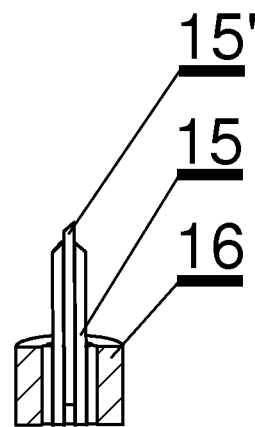
Figure 12:
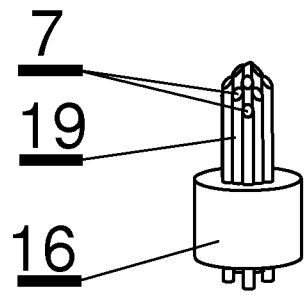
Figure 13:
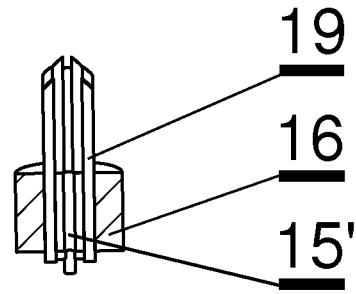
Figure 11:
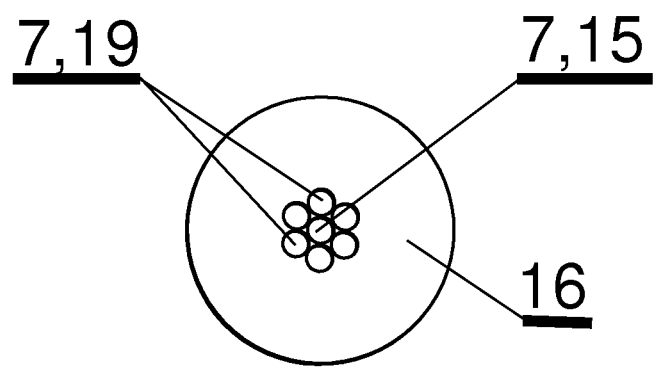
FIG. 11 shows a top view of the set from FIG. 9.
Figure 14:
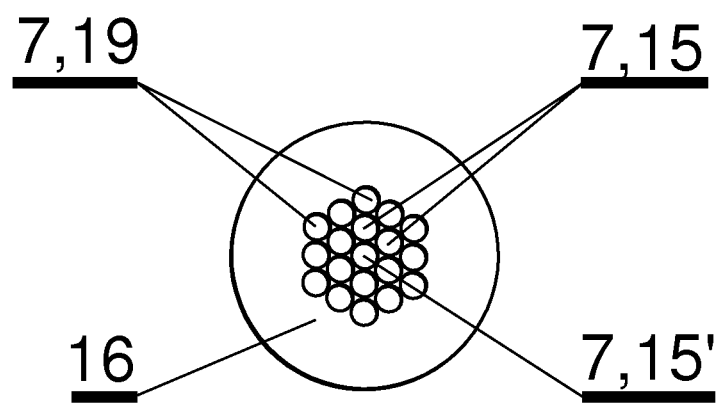
FIG. 14 shows a top view of the same set.

In first embodiment (FIG. 3 and FIG. 4) eight laser modules 1 have been used, each containing as a laser source—not shown on drawing—a red laser diode (660 nm) or violet laser diode (405 nm) with the power from 150 mW to 250 mW. Each of the eight laser modules contained the cylindrical brazen housing 2 for the laser diode. On a path of the laser beam 3 was placed the first optical system 4 (FIG. 1) in the form of a collimating lens used in known DVD laser modules, and fixed permanently to the housing 2 of the laser module 1. Lenses 4 were aspheric lenses with about 4 mm focal length so that the cross section of the laser beam 3 was below 2 mm$^2$. The applied lenses 4 had proper anti-reflection coatings for the above-mentioned colors of laser light. Eight such laser modules 1 have been placed in eight semicircular brazen holders 5 fixed concentrically to the circular brazen base plate 6. In the center of this base plate there was a set of reflecting surfaces 7 in the form of a regular pyramid 8 with the base of an octagon and altitude of 5 mm. The pyramid 8 was made from quartz crystal using the methods of semi-precious stones cutters and metalized in order to ensure good reflectivity. Both silver and aluminum metalizations have been used, and the dielectric layers protecting metallization against oxidation were selected in such way, that for the violet light the reflection losses did not exceed 6%. Instead of metallization the more expensive broadband dielectric coatings can be used, so that the reflection losses do not exceed 1%. Above the reflecting pyramid 8 the second optical system 9 was placed in the form of Thorlabs collimator (F810SMA-543) with the adapter for the fiber connector 10. The lenses of this collimator had broadband anti-reflection coatings for the whole visible range. The fiber cable 11 with SMA connector was screwed into the adapter of the collimator 9. A standard multi-mode cable 11 containing fiber 10 with 50 micron core, 125 micron cladding and numerical aperture 0.22 has been used. The angle ($\alpha$) between the optical axis 12 (FIG. 1) of each laser source 1 and the optical axis 13 (FIG. 1) of the collimator 9 was 90 degrees. Since the angle of incidence of the laser beam 3 on the corresponding face of the pyramid 8 was 45 degrees, the laser beam 3 reflected from the pyramid 8 entered the collimator 9 parallel to its optical axis. The difference in diameter of the semicircular holder 5 and the diameter of the housing 2 of the laser modules 1 was about 2 mm. This slit allowed for small changes of the spacial and angular position of the laser module 1 (positioning) ensuring precise coupling of each laser beam 3 into the fiber 10. Positioning of each laser module 1 was achieved by using an external grasper (with XYZ and angular adjustments) and by measuring the signal at the output of the fiber cable 11. After obtaining the maximum value of the signal in the fiber, the slit between the housing of the laser diode and its holder was filled with pieces of low-temperature Wood alloy 14, and heated by the hot-air blower. Wood alloy melts at the temperature around 70° C. and it fills the above-mentioned slit and solidifies in this position. After the solidification of the Wood alloy the grasper was removed and the housing 2 of the laser module 1 remained in a permanently fixed position. This method of mounting ensures good thermal contact of the laser modules 1 with the housing of the whole device (5,6) which is important for the evacuation of heat produced by high-power laser diodes. Using the above-mentioned method it was possible to couple into the fiber 10 about 55% of light power emitted by each laser diode, so that using 8 diodes with 200 mW power each, the achieved optical power in the fiber 10 was 880 mW. Instead of the regular pyramid 8 for reflecting collimated beams, in the above-described first embodiment with seven laser sources 1 it is possible to use alternatively brass rods 15 with 2 mm diameters, cut on one end at 45 degrees. The flat surface obtained in this way covered with the layer of silver or aluminum (with dielectric protective layer) becomes an individual surface 7 reflecting the laser beam 3. The alternative set of individual reflecting surfaces was created by seven such densely packed rods 15 placed in the holes of the basis plate 16 (FIGS. 9 to 11). Each rod 15 had a notch at the bottom allowing to rotate it in the base plate 16, thus rotating its reflecting surface 7 during optical adjustments. Because of the different configuration of the reflecting surfaces six laser sources 1 were mounted in one plane and the seventh source—about 5 mm higher. Similar coupling efficiency of about 55% into the fiber 10 was achieved.

Figure 5:
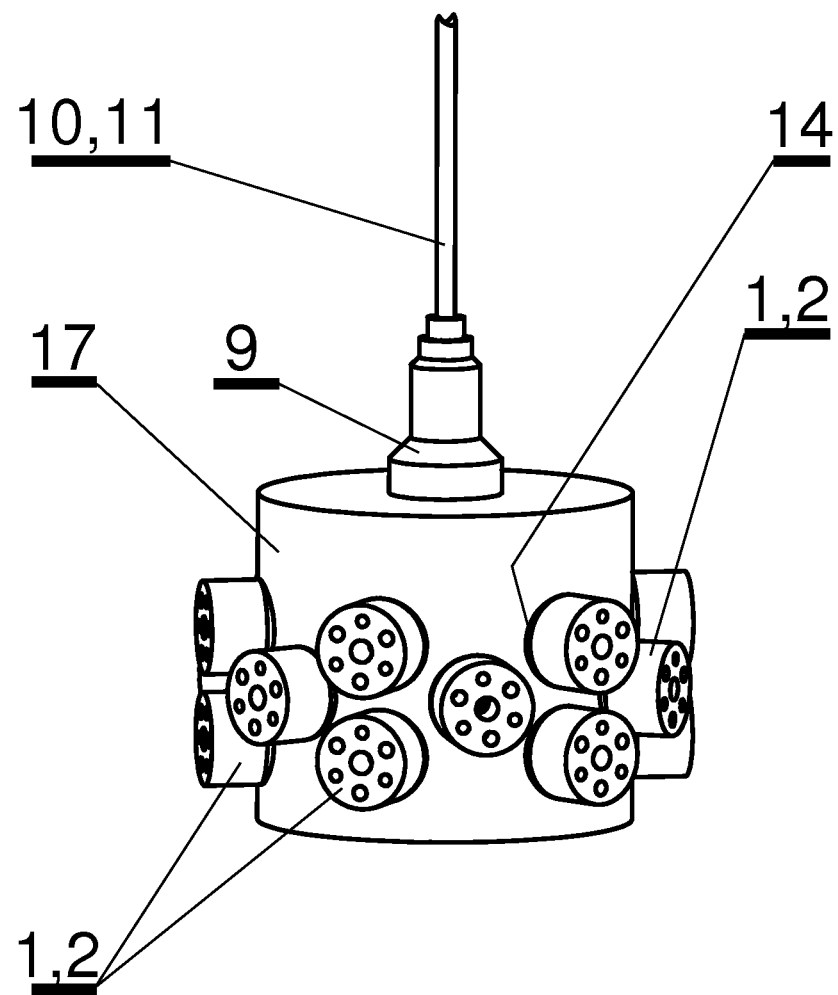
Figure 6:
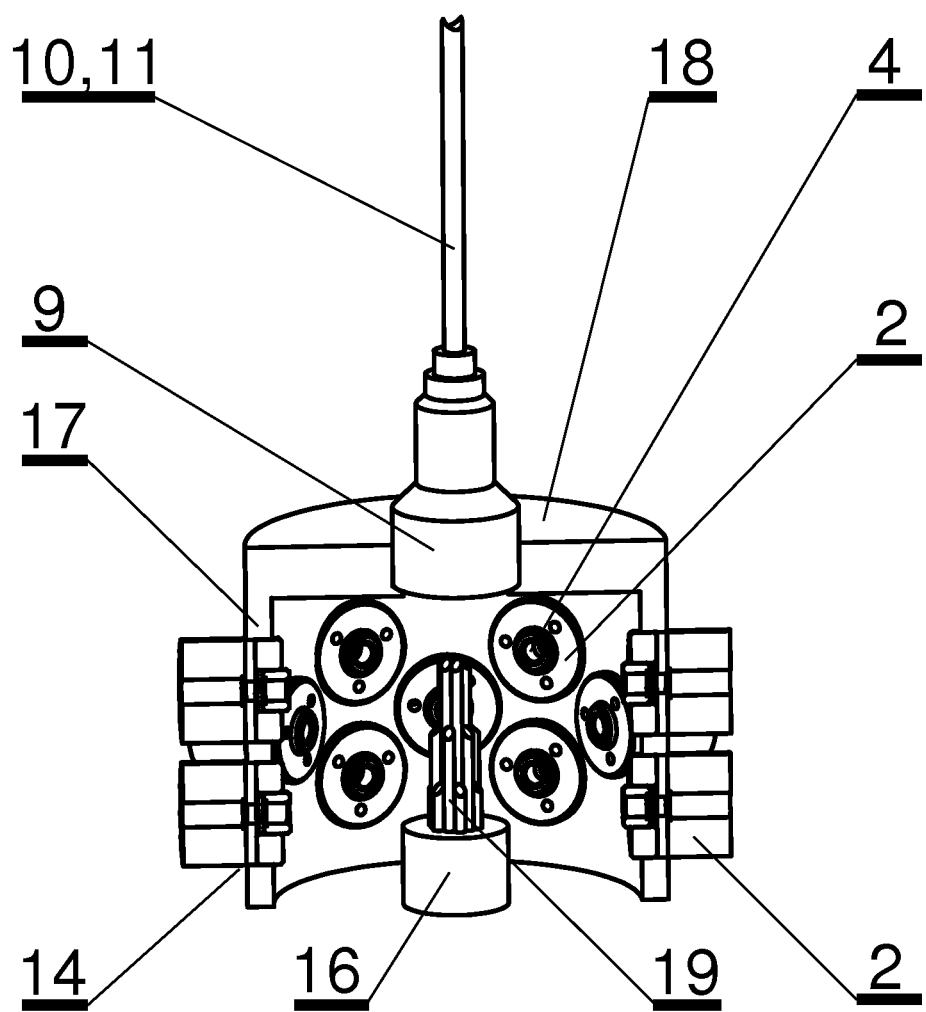
FIG. 6 shows a cross-section of the same embodiment.
Figure 7:
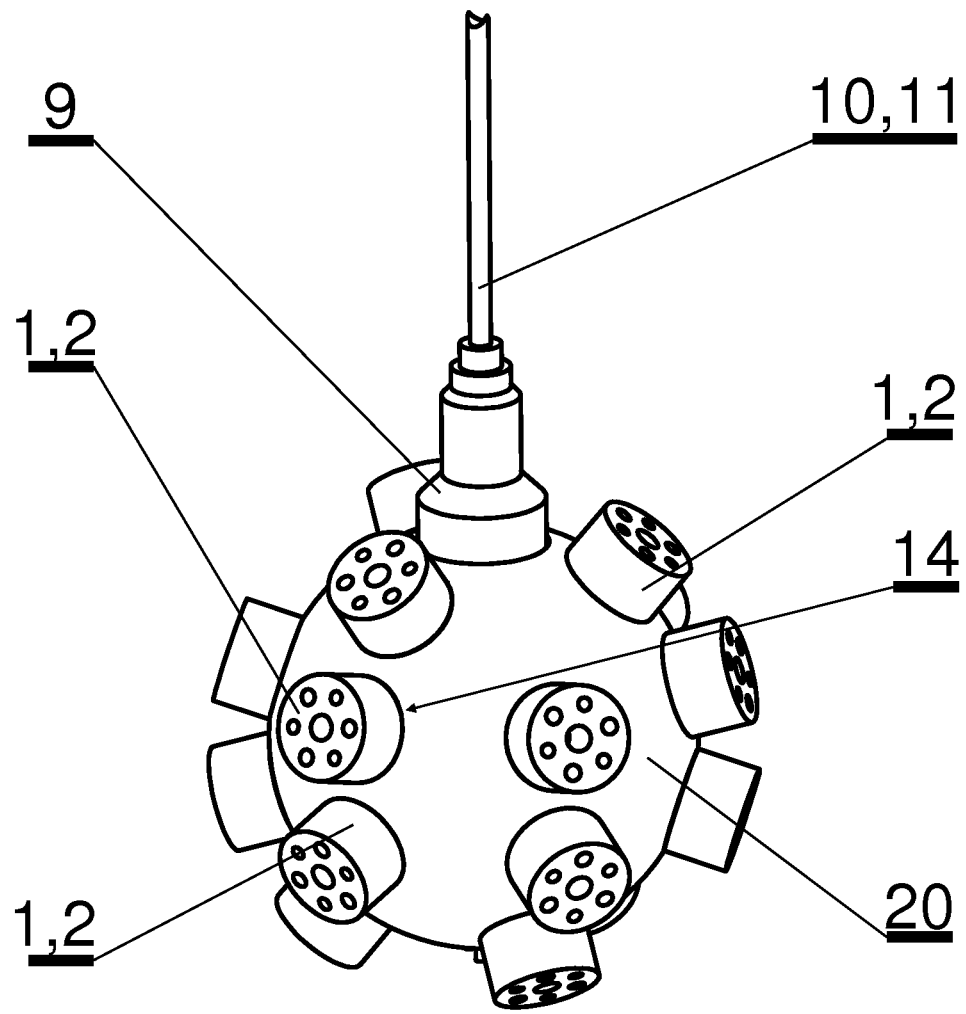
Figure 8:
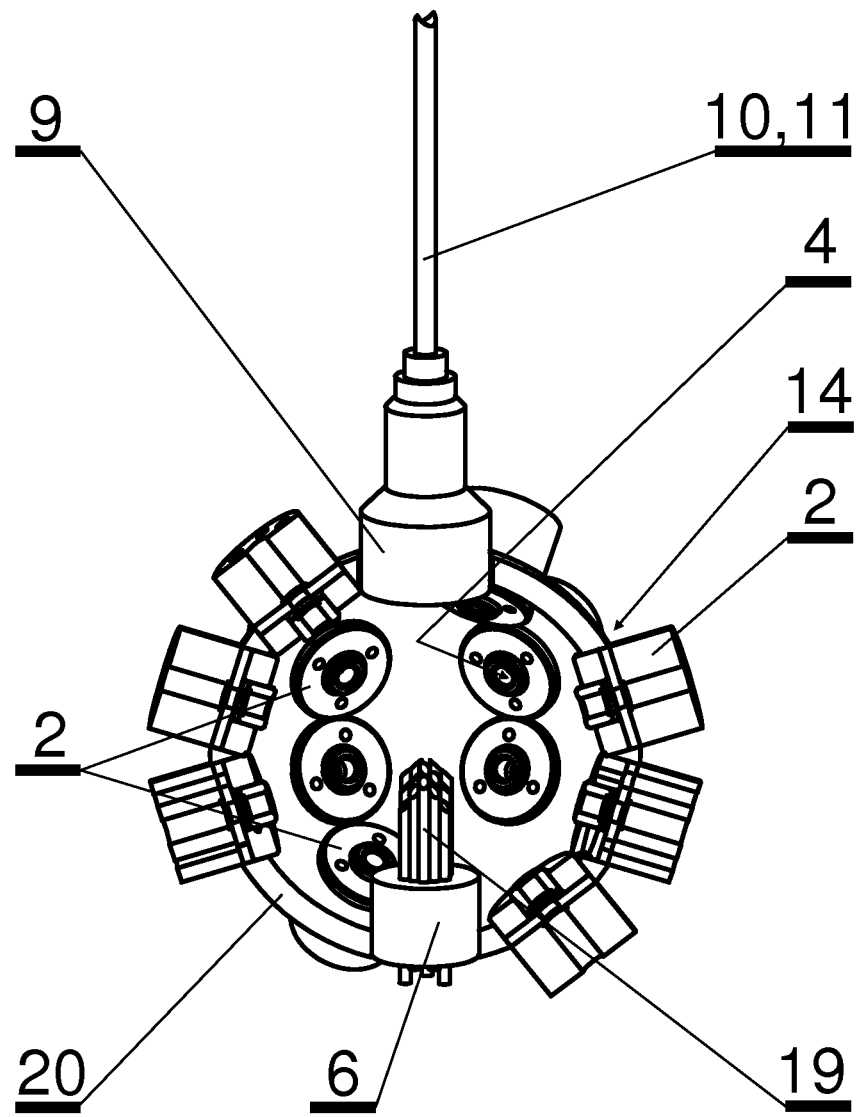
FIG. 8 shows a cross-section of the same embodiment.

In the second exemplary embodiment, presented in FIG. 5 and FIG. 6, eighteen laser modules 1 described in the first example were used. Cylindrical brazen housing 17 with inner diameter 8 cm was covered from one side with the plate 18, in which a Thorlabs fiber collimator 9 was embedded. In the other plate (not shown) covering the other side of the cylindrical housing 17, the set of nineteen rods (15, 19) with reflecting surfaces were mounted (FIGS. 2 to 14) in the base plate 16 using the method described above, with the rods 15 and 19 cut at 45 degrees. Dense packing of all 19 rods (15, 19) is the extension of the described above method of packing seven elements 15 of the reflecting system, by surrounding the first seven rods with additional twelve rods 19. Laser modules 1 were placed in eighteen openings made in the cylindrical housing 17. Also in this case there was a 2 mm difference between the diameters of the housings 2 of the laser modules 1 and the diameters of these openings. Laser modules 1 were positioned in the same way as in the previous example, but the reflecting surface 7 of the central rod 15' was unused.

The third exemplary embodiment of the invention (FIGS. 8 and 9) is a variety of the second embodiment. The difference consists only in replacing the cylindrical housing 17 by the hollow sphere 20 with 10 cm diameter. The angles of truncation of the rods (15, 19) were adjusted to the positions of laser sources 1. All other elements of the solution were identical to those in the second embodiment described above. The sphere is the optimum solution for reducing the distance between the laser modules and the collimator. The distance between the laser modules and the collimator with the fiber should be as small as possible, in order to reduce the sensitivity of the positioning to shocks and to the effect of divergence of laser beams.

The invention claimed is:

1. A method of coupling laser light derived from at least two laser sources into one optic fiber, consisting in passing a laser beam from each of the laser sources through a corresponding first optical system, single reflection from a corresponding substantially flat individual reflecting surface towards an input facet of the fiber and focusing the laser beam by a second optical system on the input facet, wherein the laser light is emitted by laser modules (1) each comprising single laser source in an individual module housing (2), with the first optical system (4) connected with this housing (2) in a fixed position with respect to the housing (2), and in the housing (2) of each laser module (1) is mounted in a holder (17, 20), the second optical system (9) is placed directly in front of the input facet (10') of the fiber (10), a first optical axis (12) of each first optical system (3) forms with a second optical axis of the second optical system (9) an angle (α) ranging from 45 (α') to 145 (α") degrees, characterized in that each of the individual reflecting surface (7) is on oblique truncations of one of a plurality of rods (15, 19) whose axes are parallel to the second optical axis (13) of the second optical system (9).

2. The method according to claim 1, characterized in that the rods (15,19) with individual reflecting surfaces (7) are densely packed in the close neighborhood of the second axis (13) of the second optical system (9).

3. The method according to claim 2, characterized in that seven rods (15) with individual reflecting surfaces are used and a first rod (15') is placed on the second optical axis (13) of the second optical system (9) while the remaining six rods (15) surround uniformly the first rod (15').

4. The method according to claim 3, characterized in that twelve rods (19) with individual reflecting surfaces (7) surrounding the first seven rods (15, 15') with individual reflecting surfaces (7) are additionally used.

5. The method according to claim 1, characterized in that the position of the laser beam (3) from each of the laser modules (1) on an input facet of the fiber (10') is adjusted by changing a position of the housing (2) of the laser module (1) with respect to its holder (17, 20), and the required position of the laser module (1) is then fixed by using a low-temperature alloy (14), advantageously Wood alloy, solidifying in a slit between the housing (2) of the laser module (1) and its holder (17, 20).

6. The method according to claim 1, characterized in that the holders for the laser modules (1) are placed in a cylindrical housing (17) which is substantially coaxial with the second optical axis (13) of the second optical system (9).

7. The method according to claim 1, characterized in that the holders for the laser modules (1) are located in a spherical housing (20) which is substantially coaxial with the optical axis (13) of the second optical system (9).

8. The method according to claim 6, characterized in that openings made in the cylindrical housing (17, 20) form the holders for the laser modules (1).

9. The method according to claim 1, characterized in that instead of the individual reflecting surfaces (7) in form of oblique truncations of the rods (15, 19), individual reflecting surfaces (7) which jointly form a lateral surface of a regular pyramid (8) are used, number of sides of the pyramid base equals the number of the laser sources (1) and the second optical axis (13) of the second optical system (9) passes through vertex and through the center of the base of the pyramid (8) and position of the laser beam (3) from each of the laser modules (1) on the input facet of the fiber (10') is adjusted by changing a position of the housing (2) of the laser module (1) with respect to its holder (5), and the required position of the laser module (1) is then fixed by using a low-temperature alloy (14), advantageously Wood alloy, solidifying in a slit between the housing (2) of the laser module (1) and its holder (5).

10. A device coupling laser light derived from at least two laser sources into one optic fiber wherein each of the laser sources comprises a first optical system (4) optically coupling with a corresponding substantially flat individual reflecting surface for directing the laser light towards an input facet of the fiber, the fiber comprising a second optical system (9) disposed at the input facet, wherein each laser source comprising a housing (2) and a first optical system (4) connected in a fixed position with respect to this housing (2), the laser source, the housing (2) and the first optical system (4) jointly form a laser module (1), the housing (2) of each laser module (1) is mounted in a holder (17, 20), the second optical system (9) is placed directly in front of the input facet (10') of the fiber (10), a first optical axis (12) of each first optical system (4) forms with a second optical axis (13) of the second optical system (9) an angle (α) ranging from 45 (α') to 145 (α") degrees, characterized in that the individual reflecting surfaces (7) there are on oblique truncations of rods (15, 19) whose axes are parallel to the second optical axis (13) of the second optical system (9).

11. The device according to claim 10, characterized in that the rods (15, 19) with the individual reflecting surfaces (7) are densely packed in the close neighborhood (13) of the second optical axis of the second optical system (9).

12. The device according to claim 11, characterized in that it contains seven rods (15) with the individual reflecting surfaces (7), and a first rod (15') is located on the second optical axis (13) of the second optical system (9) while the remaining six rods (15) surround uniformly the first rod (15').

13. The device according to claim 12, characterized in that it contains additionally twelve rods (19) with the individual reflecting surfaces (7) surrounding the first seven rods (15) with the individual reflecting surfaces (7).

14. The device according to claim 10, characterized in that the required position of the housing (2) of the laser module (1) with respect to its holder (17,20) is fixed by a low-temperature solder (14), advantageously Wood alloy, solidifying in a slit between the housing (2) of the laser module (1) and its holder (17, 20).

15. The device according to claim 10, characterized in that the holders for the laser modules (1) are in a cylindrical housing (17) which is substantially coaxial with the second optical axis (13) of the second optical system (9).

16. The device according to claim 10, characterized in that the holders for the laser modules (1) are in a spherical housing (20), which is substantially coaxial with the second optical axis (13) of the second optical system (9).

17. The device according to claim 15, characterized in that openings made in the cylindrical housing (17,20) form the holders for the laser modules (1).

18. The device according to claim 10, characterized in that instead of the individual reflecting surfaces (7) in form of oblique truncations of the rods (15, 19) the device contains individual reflecting surfaces (7) jointly forming a lateral surface of a regular pyramid (8) with number of sides of the pyramid base equal to the number of the laser sources (1), the second optical axis (13) of the second optical system (9) passes through vertex and through a center of the base of the pyramid (8), and in that position of the laser beam (3) from each of the laser modules (1) on the input facet of the fiber (10') is adjusted by changing a position of the housing (2) of the laser module (1) with respect to its holder (17, 20), and the required position of the laser module (1) is then fixed by using a low-temperature alloy (14), advantageously Wood alloy, solidifying in a slit between the housing (2) of the laser module (1) and its holder (17,20).

\* \* \* \* \*